United States Patent [19]

Merchant

[11] Patent Number: 5,648,671
[45] Date of Patent: Jul. 15, 1997

[54] LATERAL THIN-FILM SOI DEVICES WITH LINEARLY-GRADED FIELD OXIDE AND LINEAR DOPING PROFILE

[75] Inventor: Steven L. Merchant, Phoenix, Ariz.

[73] Assignee: U S Philips Corporation, New York, N.Y.

[21] Appl. No.: 571,486

[22] Filed: Dec. 13, 1995

[51] Int. Cl.⁶ .................................................. H01L 29/78
[52] U.S. Cl. .......................... 257/347; 257/404; 257/409; 257/655; 257/327; 257/345; 257/401; 257/411
[58] Field of Search .............................. 257/347, 404, 257/409, 350, 655, 327, 345, 401, 411

[56] References Cited

U.S. PATENT DOCUMENTS

| | | | |
|---|---|---|---|
| 4,247,860 | 1/1981 | Tihanyi | 357/23 |
| 5,034,790 | 7/1991 | Mukherjee | 357/23.8 |
| 5,113,236 | 5/1992 | Arnold et al. | 357/41 |
| 5,124,769 | 6/1992 | Tanaka et al. | 357/23.14 |
| 5,241,211 | 8/1993 | Tashiro | 257/507 |
| 5,246,870 | 9/1993 | Merchant | 437/21 |
| 5,300,448 | 4/1994 | Merchant et al. | 437/41 |
| 5,362,979 | 11/1994 | Merchant | 257/340 |
| 5,412,241 | 5/1995 | Merchant | 257/409 |
| 5,422,505 | 6/1995 | Shirai | 257/345 |

FOREIGN PATENT DOCUMENTS 0208863  10/1985  Japan ................................. 257/409

*Primary Examiner*—Sara W. Crane
*Assistant Examiner*—David B. Hardy
*Attorney, Agent, or Firm*—Steven R. Biren

[57] ABSTRACT

A lateral thin-film silicon-on-insulator (SOI) device includes a lateral semiconductor device such as a diode or MOSFET provided in a thin semiconductor film on a thin buried oxide. The lateral semiconductor device structure includes at least two semiconductor regions separated by a lateral drift region. By providing a substantially linear lateral doping profile in the lateral drift region, and by providing a conductive field plate on a linearly-graded top oxide insulating layer, a device structure is obtained in which conduction losses can be reduced without reducing breakdown voltage.

7 Claims, 1 Drawing Sheet

5,648,671

LATERAL THIN-FILM SOI DEVICES WITH LINEARLY-GRADED FIELD OXIDE AND LINEAR DOPING PROFILE

BACKGROUND OF THE INVENTION

The invention is in the field of Semiconductor-On-Insulator (SOI) devices, and relates more specifically to lateral thin-film SOI devices such as MOSFETS and diodes suitable for high-voltage and power applications.

In fabricating high-voltage power devices, tradeoffs and compromises must typically be made in areas such as breakdown voltage, size, conduction losses and manufacturing simplicity and reliability. Frequently, improving one parameter, such as a breakdown voltage, will result in the degradation of another parameter, such as conduction losses. Ideally, such devices would feature superior characteristics in all areas, with a minimum of operational and fabrication drawbacks.

Improvements over the basic SOI structure, in which increased breakdown voltages are achieved by providing a linear doping profile in the drift region, are shown in U.S. Pat. No. 5,246,870 and U.S. Pat. No. 5,300,448, both commonly owned with the instant application and incorporated herein by reference. In these SOI devices, the drift region between the channel and drain in a lateral MOS structure is provided with a linear lateral doping density profile, which results in substantially increased breakdown voltage characteristics. Additionally, in U.S. Pat. No. 5,246,870, a top field plate is provided over a field oxide of essentially constant thickness to permit twice the conducting charge to be placed in the drift region, thereby reducing conduction losses without reducing breakdown voltage. However, to maintain high breakdown voltage, the total amount of conduction charge near the source side of the drift region must be kept very small, thereby leading to a bottleneck for current flow and preventing optimum reduction in conduction losses.

Another approach is taken in U.S. Pat. No. 4,247,860, incorporated herein by reference, in which a Silicon-On-Sapphire (SOS) structure employs a graded field oxide in combination with a uniform lateral doping profile to achieve enhanced high-voltage operation. This technique is useful in SOS devices, where the bottom insulating layer of sapphire is several orders of magnitude thicker than the comparable layer in SOI devices SOI that voltages from below the drift region have substantially no influence on device operation, but is not applicable to SOI devices where the buried insulating layer thickness is comparable to that of the top oxide layer and the drift region charge couples to both the top field plate and the substrate, which serves as a bottom field plate. In SOS devices, to the contrary, voltages from below the drift region have no influence, due to the thickness of the bottom insulating layer, so that the drift region charge couples only to the top field plate.

Accordingly, it would be desirable to have a lateral thin-film SOI device as described above but in which conduction losses can be further reduced without reducing the breakdown voltage of the device.

SUMMARY OF THE INVENTION

It is therefore an object of the invention to provide a lateral thin-film SOI device in which conduction losses are reduced while breakdown voltage remains high.

In accordance with the invention, this object is achieved by providing a lateral thin-film SOI device with a lateral semiconductor device which is provided in a thin semiconductor film on top of a thin buried oxide insulating layer. The improvement of the invention is achieved by providing a lateral drift region having a substantially linear lateral doping profile in the thin semiconductor film, and by providing a top oxide insulting layer over the thin semiconductor film with a substantially linearly-graded portion over the lateral drift region. A conductive field plate is located on at least the linearly-graded portion of the top oxide insulating layer, and the combination of the linear lateral doping profile in the lateral drift region and the use of a conductive field plate over a linearly-graded oxide results in a device having the operational advantages of high breakdown voltage and reduced conduction losses.

The principles of the invention may be used to manufacture various types of devices, including diodes and MOSFETS. In the case of a diode configuration, the field plate is connected to a semiconductor region of the thin semiconductor film, whereas for a MOSFET, the conductive field plate remains insulated from the thin semiconductor film and extends over a channel region of the device to form a gate electrode.

Both diodes and MOSFETS fabricated in accordance with the invention will offer the operational advantages of high breakdown voltage and reduced conduction losses.

BRIEF DESCRIPTION OF THE DRAWING

The invention may be more completely understood with reference to the following detailed description, to be read in conjunction with the accompanying drawing, in which.

Figure 1:
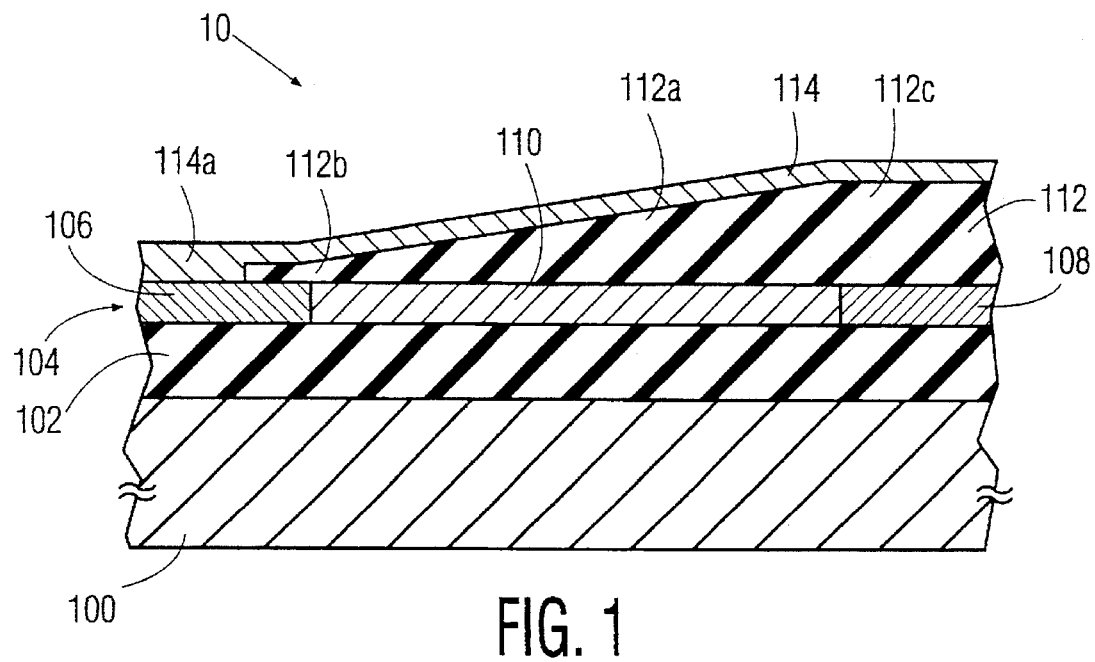
FIG. 1 shows a cross-sectional view of a lateral SOI diode structure in accordance with the invention.

In the drawing, semiconductor regions having the same conductivity type are generally shown as hatched in the same direction, and it should be noted that the figures are not drawn to scale.

DESCRIPTION OF THE PREFERRED EMBODIMENTS

A lateral thin-film SOI diode structure 10 in accordance with the invention is shown in cross-section in FIG. 1. This diode structure includes a semiconductor substrate 100, typically of n-type silicon material having a doping concentration of $10^{15}$–$10^{20}$ at/cm$^3$, on which is provided a thin buried oxide insulating layer 102, typically a silicon oxide layer of between about 0.1 micron and 5.0 microns thickness. In the device shown, insulating layer 102 may advantageously have a thickness in the range of 2–3 microns.

A thin semiconductor film 104 is provided on insulating layer 102 and has a thickness in the range of about 0.1–1.0 micron, with a lateral semiconductor device, in this case a diode, provided in the thin semiconductor film 104. In the embodiment shown in FIG. 1, the thin semiconductor film 104 includes a first region 106, here of p-type conductivity and having a doping level of about $10^{17}$ at/cm$^3$, which serves as an anode of the diode device. A cathode of the device is formed by a second region 108, here of n-type conductivity and having a doping level of about $10^{18}$ at/cm$^3$. The second region 108 is spaced apart from the first region 106 by a semiconductor lateral drift region 110, here of n-type conductivity and having a substantially linear lateral doping profile, with a doping level of about $10^{16}$ at/cm$^3$ at its left (anode) side and a doping level of about $10^{18}$ at/cm$^3$ at its right (cathode) side.

A top oxide insulating layer 112 is provided over the thin semiconductor film 104 and has a substantially linearly-graded portion 112a over the lateral drift region 110 which increases in thickness from adjacent the first region 106 to adjacent the second region 108. In the present example, the thickness of the top oxide insulating layer 112 varies from a minimum of about 0.1 micron at the area 112b adjacent the first region 106 to about 2–3 microns at the area 112c adjacent the second region 108. Advantageously, the maximum thickness of the top oxide insulating layer 112, at the area 112c, can be made substantially equal to the thickness of thin buried oxide insulating layer 102.

The device structure, as schematically shown in the cross-sectional view of FIG. 1, is completed by a conductive field plate 114 located on the top of the top oxide insulating layer 112. This conductive field plate may be made of polysilicon or other suitable conductive material and, in the diode configuration shown in FIG. 1, is connected by a portion 114a to the first region 104. Electrical connections to the conductive field plate 114, as well as the first and second regions 104 and 108 and the substrate 100 are made in a conventional manner well known to those of ordinary skill in this art and are accordingly not shown or described further here.

Figure 2:
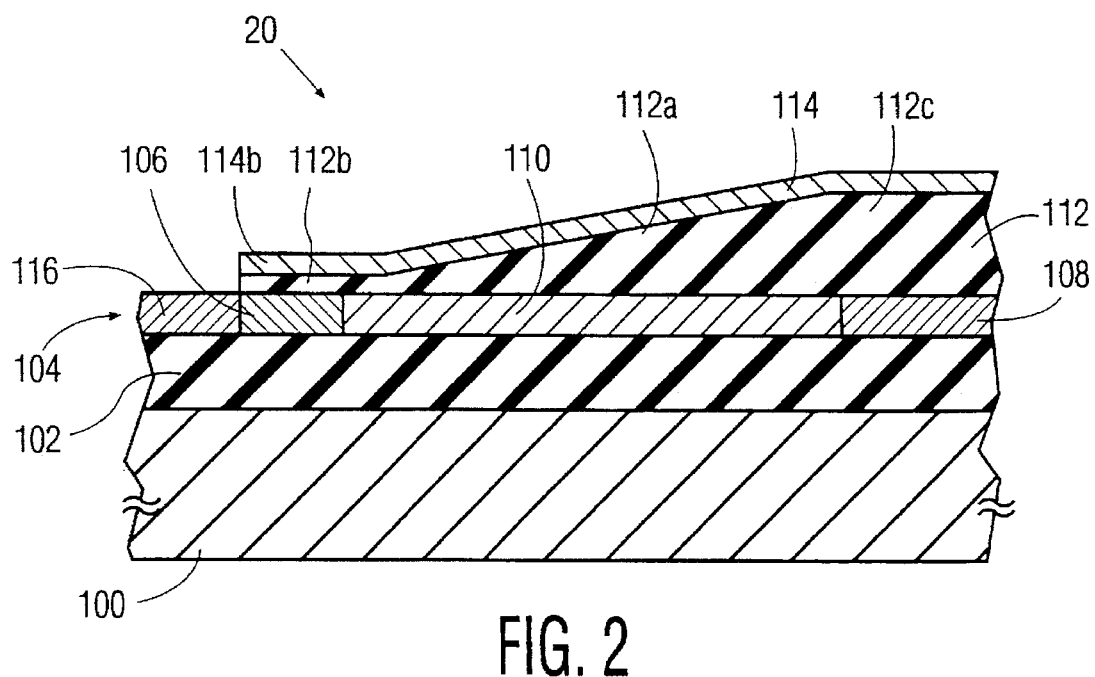
FIG. 2 shows a cross-sectional view of a lateral SOI MOSFET device in accordance with the invention.

A lateral SOI MOSFET device 20 in accordance with the invention is shown in FIG. 2. This device is in many respects similar in configuration to the diode 10 shown in FIG. 1, and like regions have been provided with like reference numerals in the two figures. Additionally, for brevity, only those portions of the MOSFET device 20 which differ from the diode structure 10 previously described will be discussed here.

In the MOSFET embodiment of FIG. 2, thin semiconductor film 104 additionally includes a third region 116 of n-type conductivity located alongside the first region 106 at a side thereof remote from the lateral drift region 110. This third region, which forms the source region of MOSFET transistor 20, can have a doping level substantially equal to that of second region 108 (which forms the drain region of the MOSFET device), in this example about $10^{18}$ at/cm$^3$. Additionally, in the MOSFET configuration of FIG. 2, the conductive field plate 114 over the top oxide insulating layer 112 is not electrically connected to the first region 106, here the channel region of the MOSFET device, but rather extends over and parallel to channel region 106 to form a gate electrode of the MOSFET device. The portion of the conductive field plate 114 which extends over and parallel to the channel region 106 is designated by reference numeral 114b in FIG. 2, and is insulated from the thin semiconductor film 104 at this area by the thin portion 112b of top oxide insulating layer 112, which forms a gate oxide and is of constant thickness, here about 0.1 micron. The remaining portions of the MOSFET device shown in FIG. 2 are configured as shown and described in connection with the diode embodiment of FIG. 1. It is noted that lateral drift region 110, here located between channel region 106 and drain region 108 of the MOSFET 20, is again provided with a substantially linear lateral doping profile, with a doping level which can vary linearly, for example, from about $10^{16}$ at/cm$^3$ at the left (channel) end of lateral drift region 110 to about $10^{18}$ at/cm$^3$ at the right (drain) end of the lateral drift region 110.

Devices in accordance with the present invention, such as those shown in FIGS. 1 and 2, can be made using conventional processing techniques well known to those of ordinary skill in this art. Thus, for example, the linear doping profile in region 110 can be achieved using a method such as that disclosed in U.S. Pat. No. 5,300,488, while the linearly-graded top oxide insulating layer 112 can be formed as shown in U.S. Pat. No. 4,247,860.

Devices in accordance with the present invention achieve the advantages of high breakdown voltage in combination with reduced conduction losses by combining the features of a lateral drift region with a substantially linear lateral doping profile and a conductive field plate over a linearly-graded portion of the top oxide insulating layer of the device over the lateral drift region. This unique combination of features results in an increase in the amount of conducting charge present at the left (anode or source) end of the device without reducing the breakdown voltage. By using a lateral drift region with a substantially linear doping profile in combination with a linearly-graded top oxide insulating layer and overlying conductive field plate, the drift charge near the right (cathode or drain) side of the lateral drift region 110 can be the same as for the structure described in U.S. Pat. No. 5,246,870, but the drift charge at the left (anode or source) side of the lateral drift region can be as much as one-half of the drift charge level at the right-hand side of the device without reducing the breakdown voltage. In the structures shown in U.S. Pat. No. 4,247,860, to the contrary, the drift charge would be laterally uniform at a lower level, thus increasing conduction losses. In this manner, the present invention achieves a combination of high breakdown voltage and reduced conduction losses not available in the prior art.

While the invention has been particularly shown and described with reference to several preferred embodiments thereof, it will be understood by those skilled in the art that various changes in form and detail may be made without departing from the spirit or scope of the invention.

What is claimed is:

1. A lateral thin-film Silicon-On-Insulator (SOI) device comprising a semiconductor substrate, a thin buried oxide insulating layer on said substrate, and a lateral semiconductor device provided in a thin semiconductor film on said thin buried oxide, said thin semiconductor film comprising a first region of a first conductivity type, a second region of a second conductivity type opposite to that of the first and spaced apart from said first region by a lateral drift region of said second conductivity type having a substantially linear lateral doping profile, a top oxide insulating layer over said thin semiconductor film and having a substantially linearly-graded portion over a major portion of said lateral drift region which increases in thickness from adjacent said first region to adjacent said second region, and a conductive field plate on at least said linearly-graded portion of said top oxide insulating layer.

2. A lateral thin-film Silicon-On-Insulator (SOI) device as claimed in claim 1, wherein said device comprises a diode, said field plate is connected to said first region, which forms a first electrode of said diode, and said second region forms a second electrode of said diode.

3. A lateral thin-film Silicon-On-Insulator (SOI) device as in claim 2, wherein a maximum thickness of said top oxide insulating layer is substantially equal to a thickness of said thin buried oxide insulating layer.

4. A lateral thin-film Silicon-On-Insulator (SOI) device as claimed in claim 1, wherein said device comprises a MOSFET, said thin semiconductor film further comprises a third region of said second conductivity type alongside said first region at a side thereof remote from said lateral drift region, said conductive field plate extends over and is insulated from said first region to form a gate electrode of said MOSFET, and said third and second regions form a source and a drain region of said MOSFET.

5. A lateral thin-film Silicon-On-Insulator (SOI) device as in claim 4, wherein a maximum thickness of said top oxide insulating layer is substantially equal to a thickness of said thin buried oxide insulating layer.

6. A lateral thin-film Silicon-On-Insulator (SOI) device as claimed in claim 1, wherein the doping level of said lateral drift region increases linearly in a direction from said first region to said second region.

7. A lateral thin-film Silicon-On-Insulator (SOI) device as in claim 6, wherein said doping level increases linearly by a factor of at least about 100.

* * * * *